(12) United States Patent
Kim et al.

(10) Patent No.: US 12,506,444 B2
(45) Date of Patent: Dec. 23, 2025

(54) POWER SUPPLY SWITCH CIRCUIT AND OPERATING METHOD THEREOF

(71) Applicant: SAMSUNG ELECTRO-MECHANICS CO., LTD., Suwon-si (KR)

(72) Inventors: Jeonghoon Kim, Suwon-si (KR); Jongok Ha, Suwon-si (KR); Youngwong Jang, Suwon-si (KR); Shinichi Iizuka, Suwon-si (KR); Hyejin Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 683 days.

(21) Appl. No.: 17/846,554

(22) Filed: Jun. 22, 2022

(65) Prior Publication Data
US 2023/0043939 A1    Feb. 9, 2023

(30) Foreign Application Priority Data

Aug. 5, 2021    (KR) .................. 10-2021-0103179

(51) Int. Cl.
*H03F 1/02*    (2006.01)
*H03F 3/195*    (2006.01)
*H03F 3/24*    (2006.01)

(52) U.S. Cl.
CPC ........... *H03F 1/0227* (2013.01); *H03F 3/195* (2013.01); *H03F 3/245* (2013.01); *H03F 2200/451* (2013.01); *H03F 2200/507* (2013.01)

(58) Field of Classification Search
CPC ........ H03F 1/0227; H03F 3/195; H03F 3/245; H03F 2200/451; H03F 2200/507;
(Continued)

(56) References Cited

U.S. PATENT DOCUMENTS 7,973,595 B2    7/2011  Kimura
11,009,902 B1   5/2021  Miwa et al.
(Continued)

FOREIGN PATENT DOCUMENTS

EP    3591782 A2 *  1/2020  ............... H02J 1/00
EP    3 465 913 B1   3/2021
(Continued)

OTHER PUBLICATIONS

Korean Office Action Issued on Jun. 30, 2025, in Counterpart Korean Patent Application No. 10-2021-0103179 (5 Pages in English, 5 Pages in Korean).
(Continued)

*Primary Examiner* — Andrea Lindgren Baltzell
*Assistant Examiner* — Jose E Pinero
(74) *Attorney, Agent, or Firm* — NSIP Law

(57) ABSTRACT

A power supply switch circuit includes a switch circuit including a first switch configured to switch a first power source voltage to a power supply terminal of a power amplifier, and a second switch configured to switch a second power source voltage to the power supply terminal; a switch controller configured to control the switch circuit; and a power supply circuit configured to supply a third power source voltage to the power supply terminal when a first voltage of the power supply terminal is lower than a predetermined second voltage.

13 Claims, 10 Drawing Sheets

(58) Field of Classification Search
CPC ........... H03F 2200/231; H03F 2200/24; H03F 2200/511; H03F 1/0211; H03F 3/189
USPC ........................................................ 330/142
See application file for complete search history.

(56) References Cited

U.S. PATENT DOCUMENTS

| | | |
|---|---|---|
| 2009/0289703 A1 | 11/2009 | Kojima et al. |
| 2010/0007419 A1 | 1/2010 | Gilbert |
| 2017/0346299 A1* | 11/2017 | Sridhar ................. G06F 1/3296 |
| 2020/0014239 A1 | 1/2020 | Liu |

FOREIGN PATENT DOCUMENTS

| | | |
|---|---|---|
| EP | 3 591 782 B1 | 5/2021 |
| JP | 2009-284150 A | 12/2009 |
| KR | 10-2019-0010569 A | 1/2019 |

OTHER PUBLICATIONS

Korean Notice of Allowance issued on Sep. 26, 2025, in corresponding Korean Patent Application No. 10-2021-0103179. (1 page in English, 2 pages in Korean).

* cited by examiner

FIG. 4

| bit2 | bit1 | SW2_CTRL | SW1_CTRL | SW1 | SW2 |
|---|---|---|---|---|---|
| 0 | 0 | Low | Low | OFF | OFF |
| 0 | 1 | Low | High | OFF | ON |
| 1 | 0 | High | Low | ON | OFF |
| 1 | 1 | Low | Low | OFF | OFF |

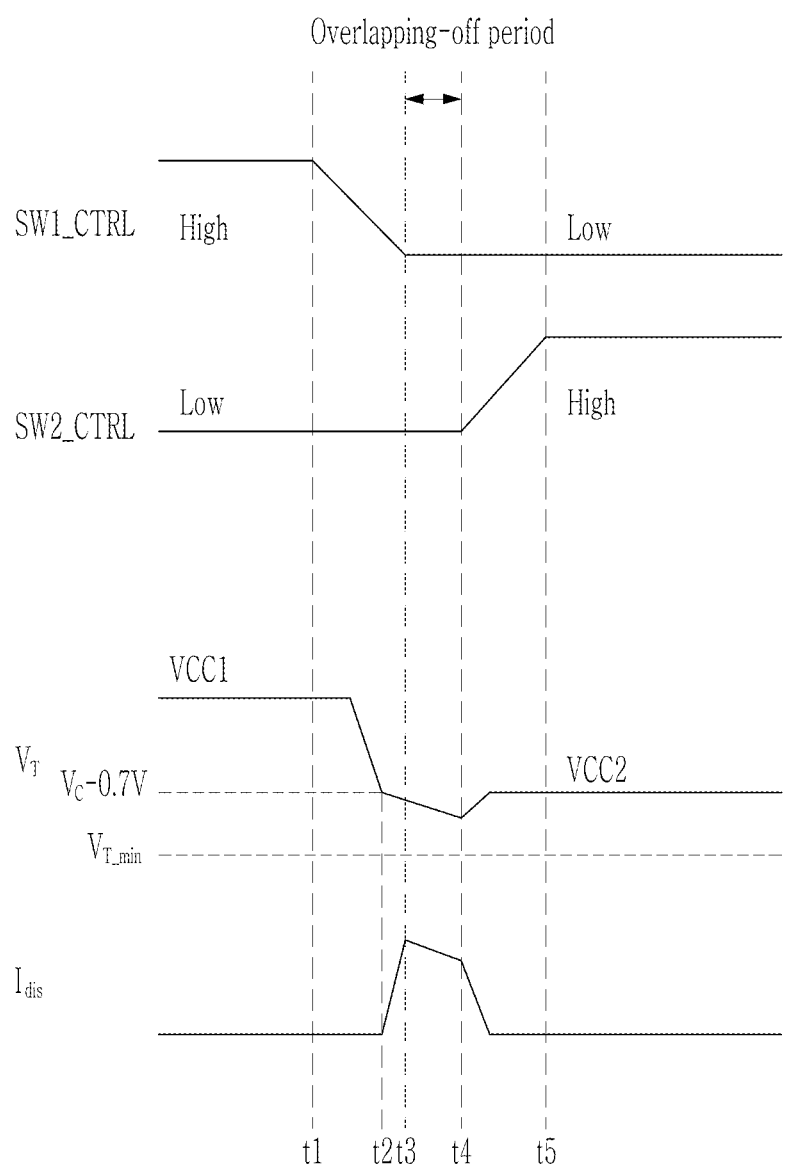

POWER SUPPLY SWITCH CIRCUIT AND OPERATING METHOD THEREOF

CROSS-REFERENCE TO RELATED APPLICATION

This application claims the benefit under 35 USC 119(a) of Korean Patent Application No. 10-2021-0103179 filed in the Korean Intellectual Property Office on Aug. 5, 2021, the entire contents of which are incorporated herein by reference for all purposes.

BACKGROUND

1. Field

The present disclosure relates to a power supply switch circuit and an operation method thereof.

2. Description of the Related Art

As wireless communication standards evolve, a plurality of communication standards such as 2G, Wi-Fi, Bluetooth, 3G, 4G, and 5G are used in one device (e.g., a smartphone). As a plurality of communication standards are used in one device, a power amplifier that outputs a transmission signal may also be used for each communication standard. That is, in order to output the signals corresponding to a plurality of communication standards, a plurality of power amplifiers corresponding to a plurality of communication standards may be required.

A power amplifier is operated by receiving an external power supply, and in general, a separate power supply IC (integrated circuit) that supplies the power to the single power amplifier is used. For example, four power supply ICs are used to operate four power amplifiers. When one communication standard among a plurality of communication standards is used, the other communication standards may not be used simultaneously. For example, when the 4G communication standard is used, the 3G communication standard may not be used.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a power supply switch circuit includes a switch circuit including a first switch configured to switch a first power source voltage to a power supply terminal of a power amplifier, and a second switch configured to switch a second power source voltage to the power supply terminal; a switch controller configured to control the switch circuit; and a power supply circuit configured to supply a third power source voltage to the power supply terminal when a first voltage of the power supply terminal is lower than a predetermined second voltage.

The switch controller may be further configured to turn on the second switch after turning off the first switch, and the power supply circuit may be further configured to supply the third power source voltage to the power supply terminal in a period between a time of turning off the first switch and another time of turning on the second switch.

The power supply circuit may include a capacitor configured to supply the third power source voltage to the power supply terminal, and a diode connected between the capacitor and the power supply terminal to form a current path.

The power supply circuit may further include a power supply generator configured to generate power for charging the capacitor.

When the first voltage is lower than the second voltage, a discharge current may be formed into the capacitor, the diode, and the power supply terminal, and the third power source voltage may be supplied to the power supply terminal by the discharge current.

A voltage charged to the capacitor may be greater than a sum of a minimum operating voltage of the power amplifier and the turn-on voltage of the diode.

The first switch and the second switch may not be simultaneously turned on.

The switch controller may be further configured to control the first switch to be turned on and the second switch to be turned off in a first period to supply the first power source voltage to the power supply terminal, control the first switch to be turned off and the second switch to be turned off in a second period, and control the first switch to be turned off and the second switch to be turned on in a third period to supply the second power source voltage to the power supply terminal.

The power supply circuit may be further configured to supply the third power source voltage to the power supply terminal in the second period.

In another general aspect, an operation method of a power supply switch circuit for selecting one of a first power source voltage and a second power source voltage to be supplied to a power supply terminal of a power amplifier, includes: supplying the first power source voltage to the power supply terminal by turning on a first switch switching the first power source voltage and turning off a second switch switching the second power source voltage in a first period; supplying a third power source voltage to the power supply terminal when the first and second switch are turned off, and a first voltage of the power supply terminal is lower than a predetermined second voltage in a second period; and supplying the second power source voltage to the power supply terminal in a third period by turning off the first switch and turning on the second switch.

The supplying of the third power source voltage may include discharging the voltage charged to the capacitor to the power supply terminal through a diode in the second period when the first voltage is lower than the second voltage in the second period.

The capacitor may be charged through a separate power supply different from a first power supply circuit generating the first power source voltage and a second power supply circuit generating the second power source voltage.

The first and second power supply circuits may be a Power Management Integrated Circuit (PM IC), and the separate power supply circuit may be a regulator.

Other features and aspects will be apparent from the following detailed description, the drawings, and the claims.

BRIEF DESCRIPTION OF THE DRAWINGS

FIG. 4 is an example of a logic table according to an embodiment.

FIG. 7 is an operation timing graph of an example of a power supply switch circuit according to another embodiment.

Throughout the drawings and the detailed description, the same reference numerals refer to the same or like elements. The drawings may not be to scale, and the relative size, proportions, and depiction of elements in the drawings may be exaggerated for clarity, illustration, and convenience.

DETAILED DESCRIPTION

Figure 1:
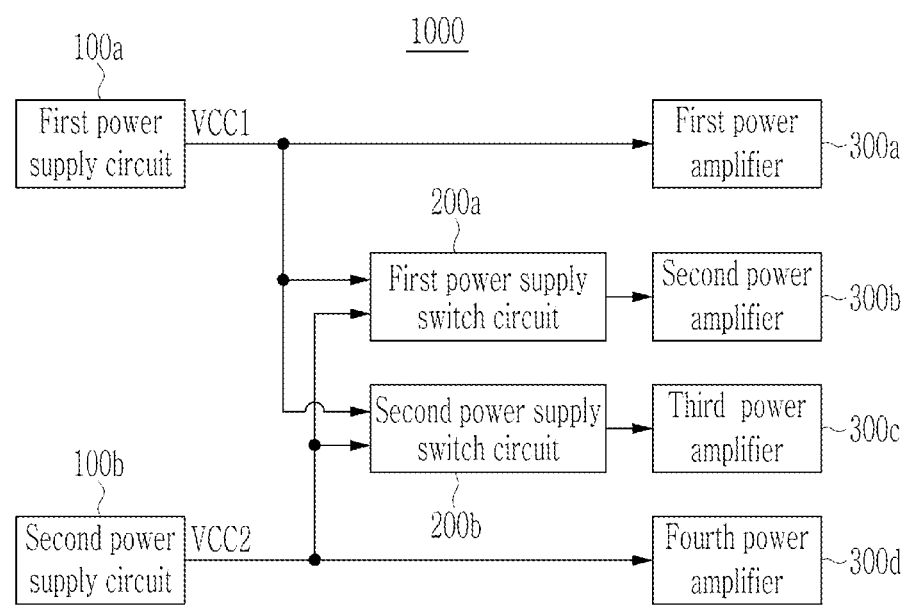
FIG. 1 is a block diagram of an example of a transmitter system according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after understanding of the disclosure of this application may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

Throughout this specification, the RF signal may have a format according to Wi-Fi (IEEE 802.11 family, etc.), WiMAX (IEEE 802.16 family, etc.), IEEE 802.20, LTE (long term evolution), Ev-DO, HSPA, HSDPA, HSUPA, EDGE, GSM, GPS, GPRS, CDMA, TDMA, DECT, Bluetooth, 3G, 4G, 5G, and other arbitrary wireless and wired protocols designated later, but is not limited thereto.

In addition, unless explicitly described to the contrary, the word "comprise", and variations such as "comprises" or "comprising", will be understood to imply the inclusion of stated elements but not the exclusion of any other elements.

FIG. 1 is a block diagram of an example of a transmitter system 1000 according to an embodiment.

As shown in FIG. 1, the transmitter system 1000, according to an embodiment, may include first and second power supply circuits 100a and 100b, first and second power supply switch circuits 200a and 200b, and first to fourth power amplifiers 300a to 300d. FIG. 1 shows a case where the transmitter system 1000 comprises four power amplifiers and two power supply switch circuits, as a non-limiting example, but the number of the power amplifiers and the power supply switch circuits may each be changed.

The first power supply circuit 100a generates and outputs the first power source voltage VCC1. According to one embodiment, the first power source voltage VCC1 may be applied to the power supply terminal of the first power amplifier 300a, the second power amplifier 300b, or the third power amplifier 300c. The value of the first power source voltage VCC1 may be changed according to an envelope of a signal input to the first power amplifier 300a, the second power amplifier 300b, or the third power amplifier 300c to support an Average Power Tracking mode (APT mode).

The second power supply circuit 100b generates and outputs the second power source voltage VCC2. According to one embodiment, the second power source voltage VCC2 may be applied to the power supply terminal of the second power amplifier 300b, the third power amplifier 300c, or the fourth power amplifier 300d. The value of the second power source voltage VCC2 may be changed according to the envelope of a signal input to the second power amplifier 300b, the third power amplifier 300c, or the fourth power amplifier 300d to support the Average Power Tracking mode (APT mode).

Meanwhile, each of the first and second power supply circuits 100a and 100b may be implemented as a PM IC (Power Management Integrated Circuit).

The first power supply switch circuit 200a receives the first power source voltage VCC1 from the first power supply circuit 100a and the second power source voltage VCC2 from the second power supply circuit 100b. The first power supply switch circuit 200a may select one of the received first and second power source voltages VCC1 and VCC2 to be output to the power supply terminal of the second power amplifier 300b. For example, when the first power amplifier 300a does not operate, the first power supply switch circuit 200a may select the first power source voltage VCC1 to be output to the power supply terminal of the second power amplifier 300b. Also, when the fourth power amplifier 300d does not operate, the first power supply switch circuit 200a may select the second power source voltage VCC2 to be output to the power supply terminal of the second power amplifier 300b.

The second power supply switch circuit 200b receives the first power source voltage VCC1 from the first power supply circuit 100a and the second power source voltage VCC2 from the second power supply circuit 100b. The second power supply switch circuit 200b may select one of the received first and second power source voltages VCC1 and VCC2 to be output to the power supply terminal of the third power amplifier 300c. For example, when the first power amplifier 300a does not operate, the second power supply switch circuit 200b may select the first power source voltage VCC1 to be output to the power supply terminal of the third power amplifier 300c. Also, when the fourth power amplifier 300d does not operate, the second power supply switch circuit 200b may select the second power source voltage VCC2 to be output to the power supply terminal of the third power amplifier 300c.

The first power amplifier 300a receives the first power source voltage VCC1 from the first power supply circuit 100a, amplifies and outputs an RF (radio frequency) signal. The input RF signal of the first power amplifier 300a may be an RF signal for the first communication standard.

The second power amplifier 300b operates by receiving the power source voltage (i.e., the first power source voltage VCC1 or the second power source voltage VCC2) selected by the first power supply switch circuit 200a, and amplifies and outputs the input RF signal. The input RF signal of the second power amplifier 300b may be an RF signal for the second communication standard.

The third power amplifier 300c operates by receiving the power source voltage (i.e., the first power source voltage VCC1 or the second power source voltage VCC2) selected by the second power supply switch circuit 200b, and amplifies the input RF signal and outputs it. The input RF signal of the third power amplifier 300c may be an RF signal for the third communication standard.

The fourth power amplifier 300d operates by receiving the second power source voltage VCC2 supplied from the second power supply circuit 100b, and amplifies and outputs an input RF (radio frequency) signal. The input RF signal of the fourth power amplifier 300d may be an RF signal for the fourth communication standard.

Here, the first to fourth communication standards may be different communication standards, and may be any one communication standard of 2G, WiFi, Bluetooth, 3G, 4G, and 5G. Meanwhile, the first to fourth communication standards may be communication standards that define different bands among the 5G communication standard.

According to this embodiment, by sharing the power source voltage through the power supply switch circuit, it is possible to reduce the number of the power supply circuits. In general, when there are four power amplifiers, four power supply circuits are used, but in FIG. 1, the number of the power supply circuits may be reduced to two by using the power supply switch circuit. Hereinafter, a detailed configuration and operation method of the power supply switch circuit, such as the first and second power supply switch circuits 200a and 200b, are described.

Figure 2:
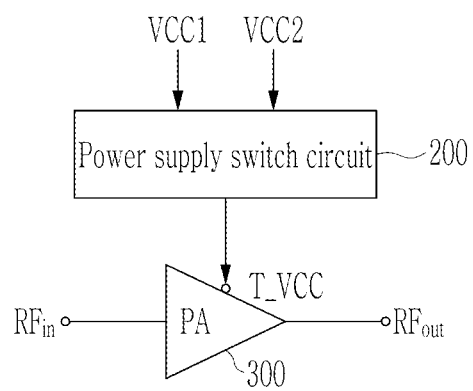
FIG. 2 is a view of an example of a connection relationship between a power supply switch circuit and a power amplifier according to an embodiment.

FIG. 2 shows a connection relation between the power supply switch circuit 200 and the power amplifier 300 according to an embodiment.

The power supply switch circuit 200 receives the first power source voltage VCC1 and the second power source voltage VCC2, and selects one power source voltage of the first and second power source voltages VCC1 and VCC2 to be output to the power supply terminal T_VCC of the power amplifier 300. The power supply switch circuit 200 may be the first power supply switch circuit 200a or the second power supply switch circuit 200b of FIG. 1.

In FIG. 1 and FIG. 2, the power supply switch circuit 200 receives two power source voltages, but at least two power source voltages may be received. In this case, the power supply switch circuit 200 may select one power source voltage among at least two power source voltages.

The power amplifier 300 includes an input terminal RFin, an output terminal Rout, and a power supply terminal T_VCC. The RF signal is input to the input terminal RFin, and the amplified signal is output to the output terminal Rout. The power source voltage VCC1 or VCC2 is applied to the power supply terminal T_VCC, and the power amplifier 300 is operated by the applied power source voltage VCC1 or VCC2. The power amplifier 300 may be implemented as a transistor. For example, when the power amplifier 300 is implemented as a Bipolar Junction Transistor (BJT), the input terminal RFin may be a base, and the power supply terminal T_VCC may be a collector or an emitter. Meanwhile, when the power amplifier 300 is implemented as a field effect transistor (FET), the input terminal RFin may be a gate and the power supply terminal T_VCC may be a drain or a source.

On the other hand, the power supply switch circuit 200 and the power amplifier 300 of FIG. 2 may be combined as a single power amplifier module.

Figure 3:
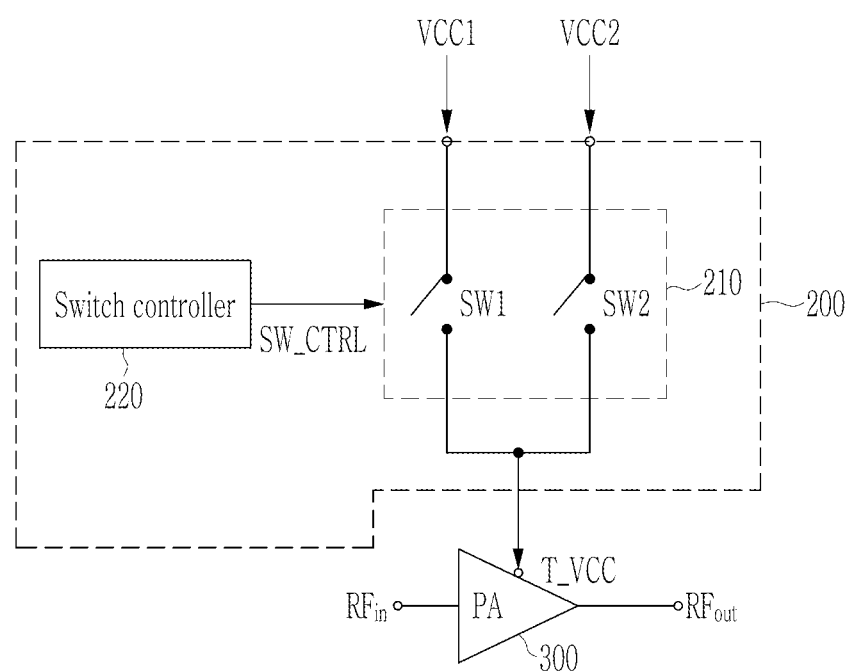
FIG. 3 is an example of an internal configuration of a power supply switch circuit of FIG. 2.

FIG. 3 is a view showing an internal configuration of the power supply switch circuit 200 of FIG. 2.

As shown in FIG. 3, the power supply switch circuit 200, according to an embodiment, may include a switch circuit 210 and a switch controller 220. The switch circuit 210 includes a first switch SW1 and a second switch SW2. The first switch SW1 switches the supply of the first power source voltage VCC1 to the power supply terminal T_VCC of the power amplifier 300, and the second switch SW2 switches the supply of the second power source voltage VCC2 to the power supply terminal T_VCC of the power amplifier 300. The first switch SW1 may be connected between the first power supply circuit 100a and the power supply terminal T_VCC of the power amplifier 300. The second switch SW2 may be connected between the second power supply circuit 100b and the power supply terminal T_VCC of the power amplifier 300.

The switch controller 220 may receive a bit signal (a digital signal) from the outside and may generate a switching control signal SW_CTRL for switching the switch circuit 210 in response to the input bit signal. The generated switching control signal SW_CTRL is output to the switch circuit 210. Here, the input bit signal may be 2 bits. The switching control signal SW_CTRL includes a first switching control signal SW1_CTRL for controlling the first switch SW1 and a second switching control signal SW2_CTRL for controlling the second switch SW2.

When the first switching control signal SW1_CTRL is at a high level and the second switching control signal SW2_CTRL is at a low level, the first switch SW1 is turned on and the first switch SW2 is turned off. Accordingly, the first power source voltage VCC1 is applied to the power supply terminal T_VCC of the power amplifier 300 through the first switch SW1.

When the first switching control signal SW1_CTRL is at a low level and the second switching control signal SW2_CTRL is at a high level, the first switch SW1 is turned off and the second switch SW2 is turned on. Accordingly, the second power source voltage VCC2 is applied to the power supply terminal T_VCC of the power amplifier 300 through the second switch SW2.

Meanwhile, the first switching control signal SW1_CTRL and the second switching control signal SW2_CTRL may not simultaneously become the high level. That is, the case where the first and second switches SW1 and SW2 are simultaneously turned on may be prevented. When the first and second switches SW1 and SW2 are simultaneously turned on, a current path may be formed from the first power supply circuit 100a to the second power supply circuit 100b or from the second power supply circuit 100b to the first power supply circuit 100a. Accordingly, the first power supply circuit 100a or the second power supply circuit 100b may be damaged. To prevent this, according to one embodiment, the first and second switches SW1 and SW2 may not be simultaneously turned on.

FIG. 4 is a view showing a logic table according to an embodiment.

In FIG. 4, a bit 1 and a bit 2 are external bit signals input to the switch controller 220. As shown in FIG. 4, when the external bit signal is 00 and 11, both the first and second switching control signals SW1_CTRL and SW2_CTRL are at a low level, and the first and second switches SW1 and SW2 are both in a turn-off state. The switch controller 220 may include a logic circuit having a logic table as shown in FIG. 4.

On the other hand, when the first switch SW1 changes from the turn-on state to the turn-off state and the second switch SW2 changes from the turn-off state to the turn-on state, the period where the first switch SW1 and the second switch SW2 are simultaneously turned on (hereinafter, referred to as 'an overlapping-on period') may occur. A rising/falling time occurs during the switching operation of the first and second switches SW1 and SW2, which may cause the overlapping-on period. This overlapping-on period may also occur even when the second switch SW2 changes from the turn-on state to the turn-off state and the first switch SW1 changes from the turn-off state to the turn-on state.

In the overlapping-on period, since the first and second switches SW1 and SW2 are simultaneously turned on, a current path may be formed from the first power supply circuit 100a to the second power supply circuit 100b or from the second power supply circuit 100b to the first power supply circuit 100a. Accordingly, the first power supply circuit 100a or the second power supply circuit 100b may be damaged.

In order to prevent the overlapping-on period, the switch controller 220, according to one embodiment, may give a time difference of an on/off between the first switch SW1 and the second switch SW2. For example, the second switch SW2 may be turned on after the first switch SW1 is completely turned off, or the first switch SW1 may be turned on after the second switch SW2 is completely turned off. In this case, since a period in which both the first and second switches SW1 and SW2 are turned off (hereinafter, referred to as 'an overlapping-off period') occurs, the power source voltage may not be applied to the power supply terminal of the power amplifier 300 in the overlapping-off period. Accordingly, the power amplifier 300 may not be operated. That is, in the period in which the voltage applied to the power supply terminal of the power amplifier 300 is changed from the first power source voltage VCC1 to the second power source voltage VCC2, a problem that the power amplifier 300 is turned off may occur. When the power amplifier 300 is turned off, a call drop may occur in the electron device, including the power amplifier 300. Hereinafter the power supply switch circuit that stably operates the power amplifier 300 even in this overlapping-off period is described with reference to FIG. 5.

Figure 5:
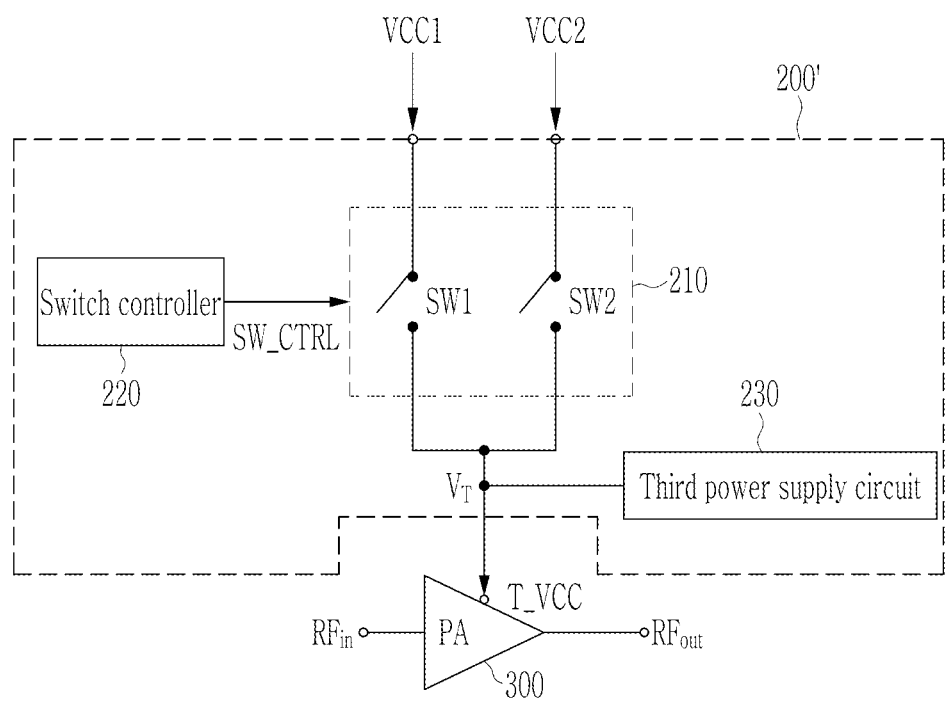
FIG. 5 is a view of an example of a power supply switch circuit according to another embodiment.

FIG. 5 is a view showing a power supply switch circuit 200' according to another embodiment.

As shown in FIG. 5, a power supply switch circuit 200', according to another embodiment, may include a switch circuit 210, a switch controller 220, and a third power supply circuit 230. The power supply switch circuit 200', according to another embodiment, is the same as the power supply switch circuit 200 except for further including the third power supply circuit 230, so the overlapping description is omitted. In FIG. 5, the voltage of the power supply terminal T_VCC is expressed as VT. Hereinafter, the voltage of the power supply terminal T_VCC is referred to as 'a power supply terminal voltage VT'.

The third power supply circuit 230 supplies predetermined power to the power supply terminal T_VCC of the power amplifier 300 in the overlapping-off period. That is, the third power supply circuit 230 supplies a predetermined power supply to prevent the power amplifier 300 from being turned off in the overlapping-off period. Here, the third power supply circuit 230 may supply a predetermined power when the power supply terminal voltage VT falls below a specific voltage.

Figure 6:
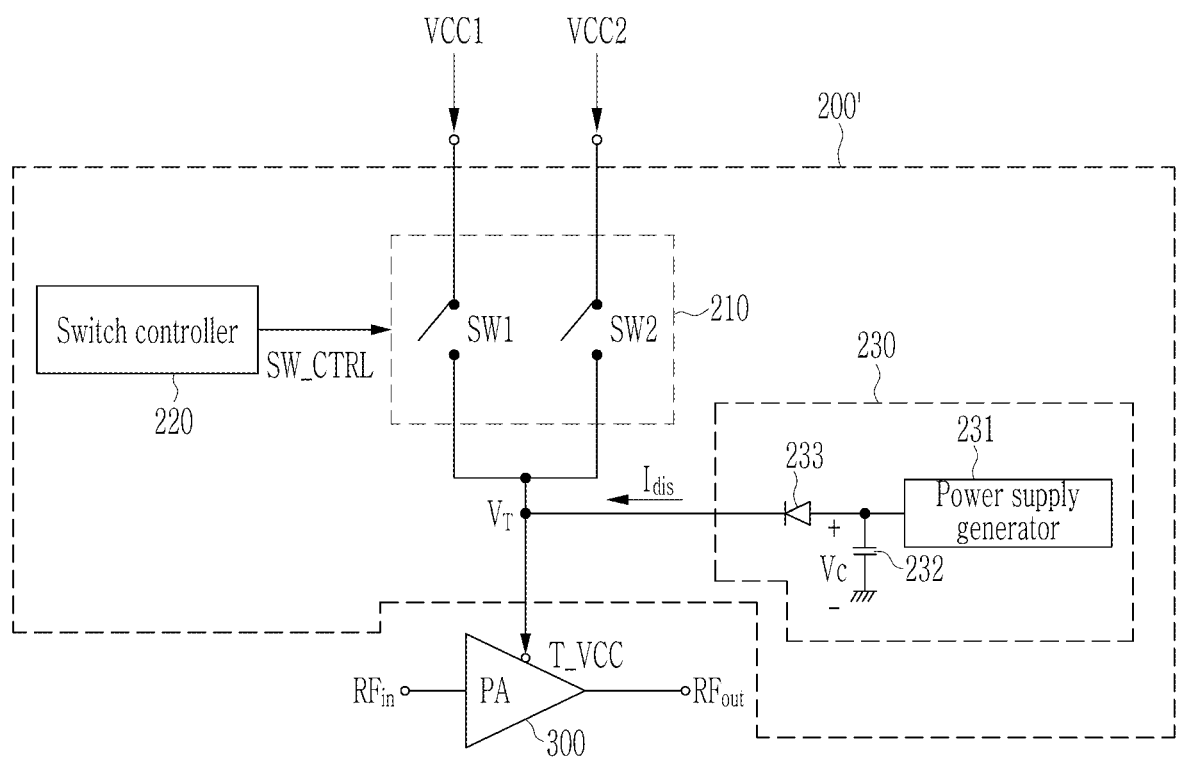
FIG. 6 is an example of an internal configuration of a third power supply circuit according to an embodiment.

FIG. 6 is a view showing an internal configuration of the third power supply circuit 230 according to an embodiment.

As shown in FIG. 6, the third power supply circuit 230 may include a power supply generator 231, a capacitor 232, and a diode 233.

The power supply generator 231 generates a constant voltage and supplies it to the capacitor 232. The power supply generator 231 may be implemented as an LDO (Low Dropout) regulator that generates a constant voltage using an external power (e.g., a battery voltage). Since the power supply generator 231 outputs a constant voltage, the capacitor 232 may be stably charged.

One terminal of the capacitor 232 is connected to the output terminal of the power supply generator 231, and the other terminal of the capacitor 232 is connected to a ground. The capacitor 232 is stably charged by the power supply generator 231 and supplies the discharge current $I_{dis}$ to the power supply terminal T_VCC of the power amplifier 300 in the overlapping-off period. The voltage at which the capacitor 232 is charged by the power supply generator 231 is expressed as VC.

The diode 233 is connected between one terminal of the capacitor 232 and the power supply terminal T_VCC of the power amplifier 300. That is, the anode of the diode 233 is connected to one terminal of the capacitor 232, and the cathode of the diode 233 is connected to the power supply terminal T_VCC of the power amplifier 300. When the power supply terminal voltage $V_T$ drops below a specific voltage, the diode 233 forms the current path so that the capacitor 232 may supply the discharge current to the power supply terminal T_VCC.

Assuming that the turn-on voltage of the diode 233 is 0.7 V, when the power supply terminal voltage $V_T$ falls below $V_C$–0.7 V in the overlapping-off period, the capacitor 232 supplies the discharge current $I_{dis}$ to the power supply terminal T_VCC. Here, the specific voltage is $V_C$–0.7 V.

Hereinafter, the operation of the power supply switch circuit 200' is described with reference to FIG. 7, and FIG. 8A to FIG. 8C.

Figure 8A:
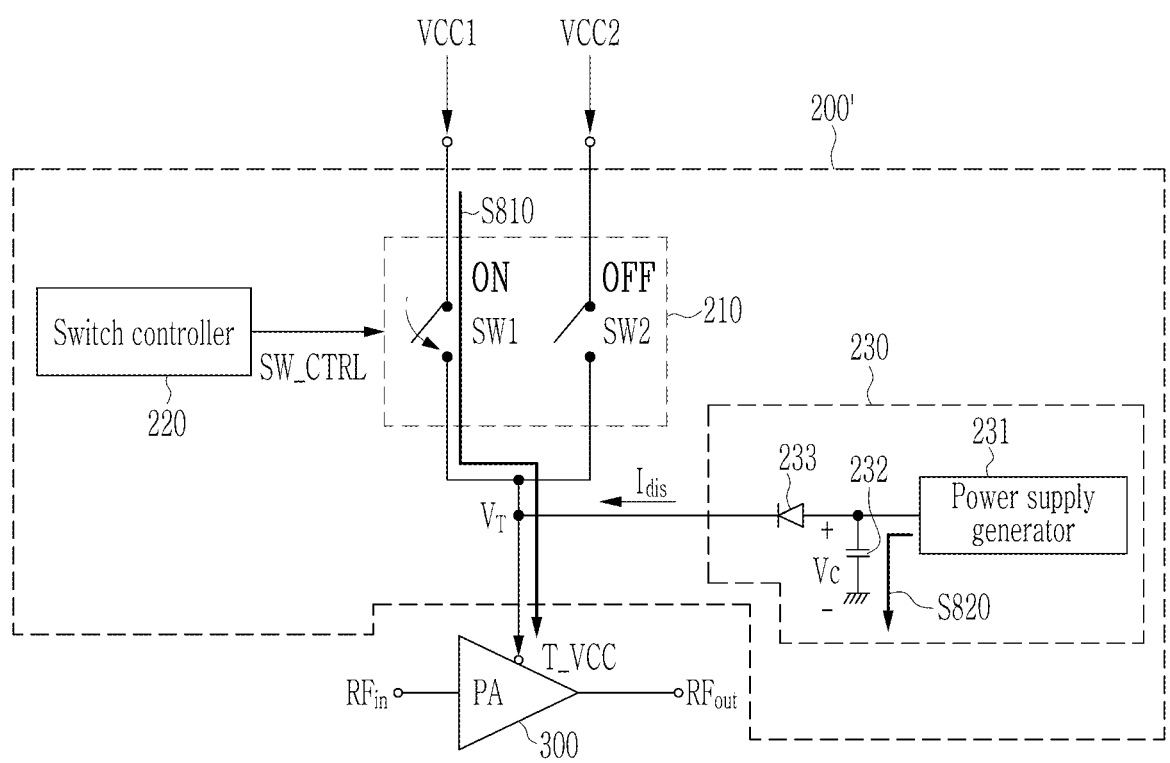
FIG. 8A to FIG. 8C are examples of a current path of first and second switch states, respectively.
Figure 8B:
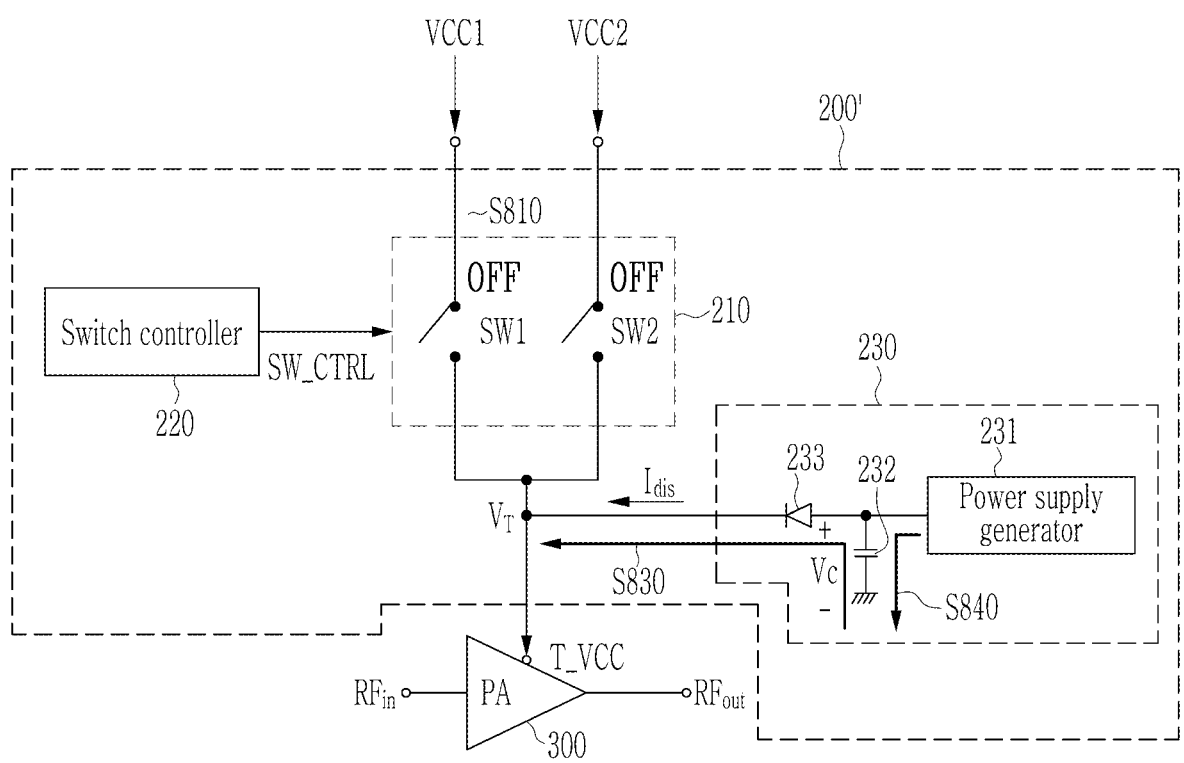
Figure 8C:
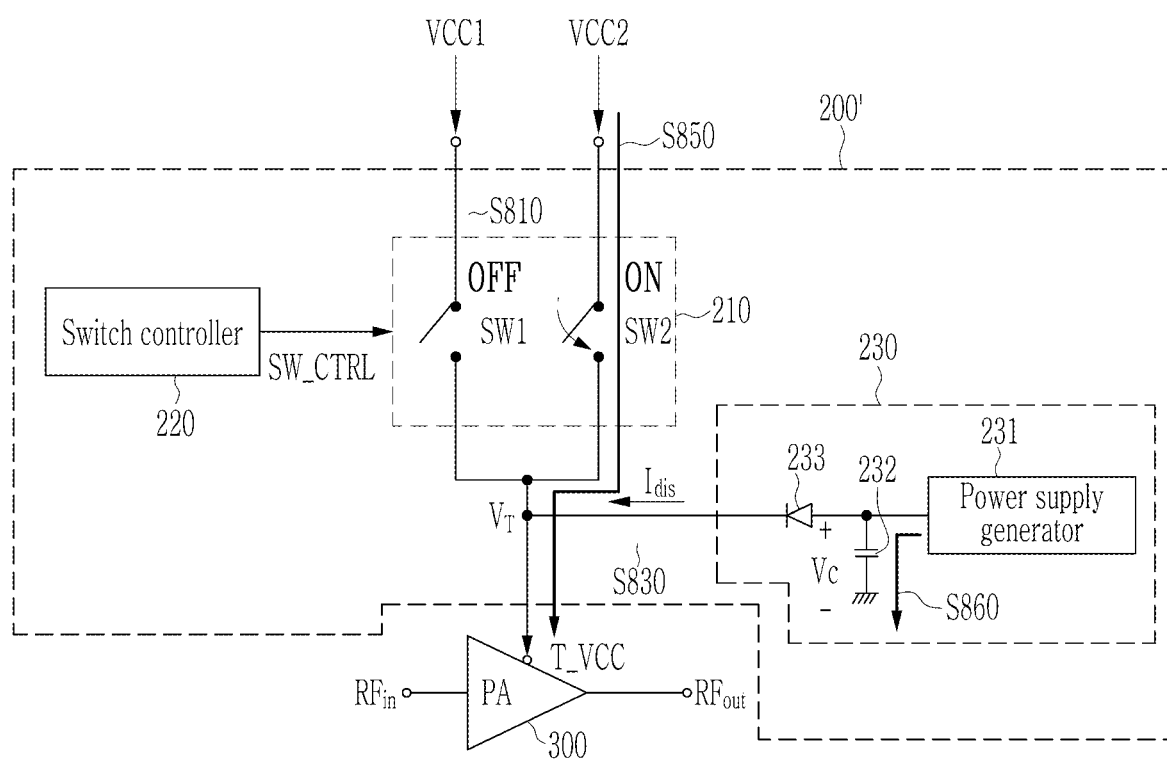

FIG. 7 shows an operation timing graph of a power supply switch circuit 200' according to another embodiment. Also, FIG. 8A to FIG. 8C are views showing a current path according to first and second switch SW1 and SW2 states, respectively.

Referring to FIG. 7, before a time t1, the first switching control signal SW1_CTRL is a high level, and the second switching control signal SW2_CTRL is a low level. Accordingly, the first switch SW1 is turned on and the second switch SW2 is turned off. FIG. 8A shows the current path generated in this case. Referring to FIG. 8A, the current path (S810) is formed into the first power source voltage VCC1, the first switch SW1, and the power supply terminal T_VCC, and then the first power source voltage VCC1 is supplied to the power supply terminal T_VCC. That is, the power supply terminal voltage $V_T$ becomes the first power source voltage VCC1. In this case, the current path (S820) is formed in to the power supply generator 231, the capacitor 232, and the ground, and then the capacitor 232 is charged with the $V_C$ voltage. On the other hand, since the voltage $V_C$ is the voltage lower than the voltage VCC1, the diode 233 is turned off (biased into a reverse direction), no discharge current (Idis) is formed.

At the time t1, the first switch SW1 is turned off and the second switch SW2 maintains the turn-off state. That is, the first switching control signal SW1_CTRL falls from a high level to a low level from the time t1 to the time t3. As the first switch SW1 is turned off, the power supply terminal voltage $V_T$ starts to fall from the first power source voltage VCC1.

Meanwhile, the time t2 positioned between the time t1 and the time t3 is a time point at which the power supply terminal voltage $V_T$ falls and then becomes the specific voltage (e.g., VC–0.7 V). The power supply terminal voltage ($V_T$) drops to the specific voltage, and at the time t2, the capacitor 232 starts supplying the discharge current $I_{dis}$ to the power supply terminal T_VCC. That is, at the time t2, since the power supply terminal voltage is VC–0.7 V, the diode 233 is turned on and the discharge current Idis flows to the power supply terminal T_VCC. Referring to FIG. 8B, the current path (S830) is formed into the capacitor 232, the diode 233, and the power supply terminal T_VCC, and the discharge current $I_{dis}$ is supplied to the power supply terminal T_VCC.

Then, the discharge current $I_{dis}$ is formed and simultaneously the discharge charge of the capacitor 232 is supplemented by the power supply generator 231 (S840). Accordingly, referring to FIG. 7, between the time t2 and the time t4, the power supply terminal voltage $V_T$ remains higher than $V_{T\_min}$. Here, $V_{T\_min}$ corresponds to the minimum operation voltage desired for the power amplifier 300 to operate. The charging voltage $V_c$ of the capacitor 232 and the minimum operation voltage $V_{T\_min}$ of the power amplifier 300 may have a relationship of Equation 1 below.

$$V_C - V_{diode\_on} > V_{T\_mim} \qquad \text{(Equation 1)}$$

In Equation 1, $V_{diode\_on}$ corresponds to a turn-on voltage of the diode 233. As one example, $V_{diode\_on}$ may be 0.7 V. Equation 1 may be converted like Equation 2 below.

$$V_C > V_{T\_mim} + V_{diode\_on} \qquad \text{(Equation 2)}$$

Referring to Equation 2, the charging voltage $V_C$) of the capacitor 232 needs to be set to a voltage greater than the sum of the minimum operation voltage $V_{T\_min}$ of the power amplifier 300 and the turn-on voltage $V_{diode\_on}$ of the diode 233. To this end, the power supply generator 231 may generate an output voltage satisfying Equation 2 and supply it to the capacitor 232.

Referring to FIG. 7, at the time t3, the first switching control signal SW1_CTRL becomes completely the low level, and the second switching control signal SW2_CTRL is not directly converted to the high level at the time t3 and maintains the low level. To create an overlapping-off period, the second switching control signal SW2_CTRL is raised to a high level at the time t4. In FIG. 7, the overlapping-off period corresponds to the period between the time t3 and the time t4. Even in this overlapping-off period, the discharge current $I_{dis}$ continues to flow. That is, as shown in FIG. 8B, the current path (S830) is formed, and the discharge current (Idis) is continuously supplied to the power supply terminal T_VCC).

After the time t4, the second switching control signal SW2_CTRL rises, and the first switching control signal SW1_CTRL maintains a low level. Therefore, the second switch SW2 is turned on and the first switch SW1 maintains the turn-off state. Referring to FIG. 8C, the second power source voltage VCC2, the second switch SW2, and the power supply terminal T_VCC form the current path (S850), and the second power source voltage VCC2 is supplied to the power supply terminal T_VCC. That is, the power supply terminal voltage $V_T$ becomes the second power source voltage VCC2. At this time, a current path (S860) is formed through the power supply generator 231, capacitor 232, and ground, and the capacitor 232 is charged with the voltage VC. Meanwhile, since the second power source voltage VCC2 is higher than $V_C$–0.7 V, the diode 233 is turned off (biased in a reverse-direction), so that the discharge current Idis may not be formed.

As such, according to at least one embodiment of the embodiments, it is possible to prevent the power circuit from being damaged by setting a separate overlapping-off period when the power supply of the power amplifier 300 is switched. And by supplying the power to the power amplifier through a separate power in the overlapping-off period, it is possible to prevent the power amplifier from being turned off. That is, even in the overlapping-off period, the power is supplied to the power amplifier, thereby preventing the call dropping of the electron device.

On the other hand, since the overlapping-off period is a fairly short time, in the third power supply circuit 230 of FIG. 6, the third power supply circuit may be implemented through only the capacitor 232, excluding the power supply generator 231 and the diode 233. That is, the discharge current may be supplied to the power supply terminal T_VCC through only the capacitor 232. However, when the discharge current is supplied to the capacitor 232 only, the voltage charged to the capacitor 232 is not stable, so the amount of current supplied to the power supply terminal T_VCC may be unstable. More specifically, when only the capacitor 232 is used, the capacitor 232 is charged by the first power source voltage VCC1 or the second power source voltage VCC2; however, the first and second power source voltages VCC1 and VCC2 may be changed depending on the input signal envelope of the power amplifier 300. As a result, the capacitor 232 repeats the charging and discharging, and the charging voltage of the capacitor 232 becomes unstable. In contrast to this, in the third power supply circuit 230 of FIG. 6, the capacitor 232 is not only stably charged through the power supply generator 231, but also the discharge current may be stably supplied when the power supply terminal voltage $V_T$ drops below the specific voltage through the diode 233.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A power supply switch circuit comprising:
a switch circuit comprising a first switch configured to switch a first power source voltage to a power supply terminal of a power amplifier, and a second switch configured to switch a second power source voltage to the power supply terminal, wherein the first power source voltage is generated by a first power supply circuit and the second power source voltage is generated by a second power supply circuit;
a switch controller configured to control the switch circuit; and
a third power supply circuit configured to supply a third power source voltage to the power supply terminal when a first voltage is lower than a predetermined second voltage, wherein the first voltage is a voltage at the power supply terminal, and
wherein the third power supply circuit is a separate power supply circuit from the first power supply circuit and the second power supply circuit.

2. The power supply switch circuit of claim 1, wherein the switch controller is further configured to turn on the second switch after turning off the first switch, and
the third power supply circuit is further configured to supply the third power source voltage to the power supply terminal in a period between a time of turning off the first switch and another time of turning on the second switch.

3. The power supply switch circuit of claim 1, wherein the third power supply circuit comprises:
a capacitor configured to supply the third power source voltage to the power supply terminal; and
a diode connected between the capacitor and the power supply terminal to form a current path.

4. The power supply switch circuit of claim 3, wherein the third power supply circuit further comprises a power supply generator configured to generate power for charging the capacitor.

5. The power supply switch circuit of claim 3, wherein when the first voltage is lower than the predetermined second voltage, a discharge current is formed into the capacitor, the diode, and the power supply terminal, and the third power source voltage is supplied to the power supply terminal by the discharge current.

6. The power supply switch circuit of claim 3, wherein a voltage charged to the capacitor is greater than a sum of a minimum operating voltage of the power amplifier and the turn-on voltage of the diode.

7. The power supply switch circuit of claim 1, wherein the first switch and the second switch are not simultaneously turned on.

8. The power supply switch circuit of claim 1, wherein the switch controller is further configured to:
control the first switch to be turned on and the second switch to be turned off in a first period to supply the first power source voltage to the power supply terminal;
control the first switch to be turned off and the second switch to be turned off in a second period; and
control the first switch to be turned off and the second switch to be turned on in a third period to supply the second power source voltage to the power supply terminal.

9. The power supply switch circuit of claim 8, wherein the third power supply circuit is further configured to supply the third power source voltage to the power supply terminal in the second period.

10. An operation method of a power supply switch circuit for selecting one of a first power source voltage and a second power source voltage to be supplied to a power supply terminal of a power amplifier, comprising:
in a first period, supplying the first power source voltage to the power supply terminal by turning on a first switch switching the first power source voltage and turning off a second switch switching the second power source voltage;
in a second period, turning off the first and second switch and supplying a third power source voltage to the power supply terminal when a first voltage is lower than a predetermined second voltage, wherein the first voltage is a voltage at the power supply terminal; and in a third period, supplying the second power source voltage to the power supply terminal by turning off the first switch and turning on the second switch.

11. The operation method of claim 10, wherein the supplying of the third power source voltage comprises discharging the voltage charged to a capacitor to the power supply terminal through a diode in the second period when the first voltage is lower than the predetermined second voltage in the second period.

12. The operation method of claim 11, wherein
the capacitor is charged through a separate power supply circuit different from a first power supply circuit generating the first power source voltage and a second power supply circuit generating the second power source voltage.

13. The operation method of claim 12, wherein
the first and second power supply circuits are a Power Management Integrated Circuit (PM IC), and the separate power supply circuit is a regulator.

* * * * *